United States Patent [19]

Tawara et al.

[11] Patent Number: 4,567,576

[45] Date of Patent: Jan. 28, 1986

[54] METHOD FOR PRODUCING A MAGNETIC BIAS FIELD

[75] Inventors: Yoshio Tawara; Ken Ohashi, both of Fukui; Hideaki Kikuchi, Tokyo, all of Japan

[73] Assignee: Shin-Etsu Chemical Co., Ltd., Tokyo, Japan

[21] Appl. No.: 579,996

[22] Filed: Feb. 14, 1984

Related U.S. Application Data

[62] Division of Ser. No. 425,956, Sep. 28, 1982, abandoned.

[30] Foreign Application Priority Data

Oct. 2, 1981 [JP] Japan .............................. 56-156988

[51] Int. Cl.[4] .............................................. G11C 5/02

[52] U.S. Cl. .......................................... 365/2; 365/27; 148/31.57; 420/416; 420/435; 420/455; 420/580

[58] Field of Search ..................... 148/31.57, 402, 408, 148/409, 411, 425, 426, 435; 420/416, 435, 455, 580; 365/2, 27

[56] References Cited

U.S. PATENT DOCUMENTS 3,560,200 2/1971 Nesbitt et al. .................... 148/31.57
3,701,659 10/1972 Buschow et al. ................ 148/31.57
3,931,618 1/1976 Lacey ..................................... 365/2
4,063,971 12/1977 Geinacher et al. .............. 148/31.57
4,208,225 6/1980 Kurz et al. ....................... 148/31.57

FOREIGN PATENT DOCUMENTS 55-27612 7/1980 Japan .............................. 148/31.57
2071146 9/1981 United Kingdom ............ 148/31.57

*Primary Examiner*—John P. Sheehan
*Attorney, Agent, or Firm*—Hopgood, Calimafde, Kalil, Blaustein & Judlowe

[57] ABSTRACT

The invention provides a method for producing a magnetic bias field in a magnetic bubble domain memory device. The method comprises coupling a magnetic bubble domain element with a permanent magnet. The permanent magnet is formed of a rare earth metal-containing alloy for use in the bubble domain memory device in respect of the reversible temperature coefficient of the magnet capable of being in compliance with the temperature coefficient of the bubble disappearance field of the memory device. The alloy characteristically contains nickel as an essential component so that the composition of the alloy is expressed by the formula $$R(Co_{1-x-y}Cu_xNi_y)_z,$$

in which R is a rare earth element, e.g. samarium or cerium, and s, y and z are each a positive number from 0.001 to 0.4, from 0.001 to 0.6 and from 4.0 to 9.0, respectively, with the proviso that x+y is smaller than 1.

4 Claims, No Drawings

METHOD FOR PRODUCING A MAGNETIC BIAS FIELD

CROSS REFERENCE TO RELATED APPLICATION

This application is a division of our application Ser. No. 425,956 filed Sept. 28, 1982 and entitled "Rare Earth Metal-Containing Permanent Magnet Alloys", now abandoned.

BACKGROUND OF THE INVENTION

The present invention is directed to a method for producing a magnetic bias field in a bubble domain memory device. The method comprises coupling a magnetic element with a permanent magnetic. The permanent magnet is formed of a rare earth metal-alloy.

Several classes of materials are known hitherto for the magnetic bubble domain memory films formed on the surface of a substrate such as a single crystal wafer of gadolinium gallium garnet including films of orthoferrites, magnetoplumbites and rare earth-containing garnets as well as amorphous films thereof. Among the above named classes, the materials currently on practical use are the rare earth-iron garnets expressed by the general formula $R_3Fe_5O_{12}$, in which R is a rare earth element, from the standpoints of high density of integration and high velocity of operation as exemplified by yttrium iron garnet of the formula $Y_3Fe_5O_{12}$.

A magnetic bubble domain memory device is constructed with the film of such a magnetic bubble domain material formed on a suitable substrate, to which a magnetic bias field is applied in a strength adequate for the formation of magnetic bubbles in the material. The magnetic bias field is usually obtained with a permanent magnet and the performance thereof naturally influences heavily the performance of the magnetic bubble domain memory device. In this connection, there is a requirement that the temperature coefficient of the magnetic bias field produced by the permanent magnet should be in coincidence with or about the same as the temperature coefficient of the magnetic bubble disappearance field $H_0$ of a given magnetic bubble domain material. In this regard, it is the conventional practice to select a permanent magnet having a temperature coefficient as close as possible to the temperature coefficient of the bubble disappearance field $H_0$ of the given magnetic bubble domain material or to modify the composition and/or the method of preparation of the magnetic bubble domain material so that the material has a modified temperature coefficient of the bubble disappearance field $H_0$ in coincidence with or close to the reversible temperature coefficient of the given permanent magnet.

It is known that the temperature coefficient of the bubble disappearance field $H_0$ of the practical magnetic bubble domain materials ranges widely from −0.1%/°C. to −0.6%/°C. so that no sufficient coverage is obtained with conventional permanent magnets. For example, the reversible temperature coefficients of the so-called Alnico magnets mainly composed of aluminum, nickel, cobalt and iron and the ferrite magnets of which the main constituent is barium ferrite are about −0.03%/°C. and about −0.2%/°C., respectively. On the other hand, rare earth metal-containing permanent magnets, mainly composed of a rare earth metal and cobalt, have temperature coefficient of about −0.03%/°C. in the samarium-cobalt based ones and about −0.09%/°C. in the cerium-cobalt based ones.

Therefore, these rare earth metal-containing permanent magnets are not satisfactory in practical use as a bias magnet in the magnetic bubble domain memory devices despite their excellent properties as a permanent magnet for general purpose. Accordingly, it has been the most widely practiced way in the magnetic bubble domain memory devices that the temperature coefficient of the bubble disappearance field $H_0$ in the rare earth-iron garnet as the magnetic bubble domain material is modified by the addition of a small amount of a modifier element such as lutetium and the like into the garnet material so that the temperature coefficient of the bubble disappearance field thereof is brought into coincidence as close as possible with the temperature coefficient of the ferrite magnets as the permanent magnet for the bias field although no quite satisfactory results have yet been obtained.

SUMMARY OF THE INVENTION

It is therefore an object of the present invention to provide a method of producing a magnetic bias field in a magnetic bubble domain memory device, in which the reversible temperatue coefficient of the magnetic field is in close coincidence with the temperature coefficient of the bubble disappearance field $H_0$ of the magnetic bubble domain materials without specific modification of the composition thereof. The method comprises coupling a magnetic bubble domain element with a permanent magnet. The permanent magnet is formed of a rare earth metal-containing alloy having the general formula $$R(Co_{1-x-y}Cu_xNi_y)_z,$$

in which R is a rare earth element and x, y and z are each positive numbers, x ranges from 0.001 to 0.4, y ranges from 0.001 to 0.6, and z ranges from 4.0 to 9.0, with the proviso that x+y is less than 1.

As a result of their extensive investigations, the inventors have arrived at a discovery that addition of nickel to the composition of the rare earth metal-containing magnet alloy is effective in so much decreasing the reversible temperature coefficient of the permanent magnet alloy composed of a rare earth metal, cobalt and copper with optional admixture of one or more of the adjuvant elements selected from the group consisting of calcium, silicon and transition metals other than nickel and cobalt and also at a discovery that the temperature coefficient in question can be varied in a wide range by suitably selecting the kinds and amounts of the rare earth metal as the main ingredient of the magnet alloy and the adjuvant elements.

The rare earth metal-containing permanent magnet alloy of the invention, completed on the basis of the above discoveries, has a composition expressed by the general formula $$R(Co_{1-x-y}Cu_xNi_y)_z,$$

in which R is a rare earth element and x, y, and z are each a positive number in the range from 0.001 to 0.4 inclusive for x, from 0.001 to 0.6 inclusive for y and from 4.0 to 9.0 inclusive for z, respectively, with the proviso that x+y is smaller than 1.

In addition, the magnet alloy of the invention may contain one or more of further adjuvant elements so that the composition of the magnet alloy may be expressed by the general formula $R(Co_{1-x-y-u}Cu_xNi_yM_u)_z$, in which M is one or a combination of the elements selected from the group consisting of calcium, silicon and transition metals other than nickel and cobalt and u is a positive number not exceeding 0.6 with the proviso that x+y+u is smaller than 1, the meanings of the other symbols being the same as in the first given compositional formula.

DETAILED DESCRIPTION OF THE PREFERRED EMBODIMENTS

As is understood from the above description, the permanent magnet alloy of the invention essentially contains a rare earth metal denoted by R, cobalt, copper and nickel and optionally contains calcium, silicon or a transition metal other than cobalt and nickel. The rare earth metals particularly suitable in the invention include cerium and samarium although the other kinds of rare earth metals may be used in a relatively small amount in combination with these metals.

The most characteristic component in the inventive magnet alloy is, as is mentioned before, nickel. The reversible temperature coefficient of the rare earth metal-containing permanent magnet decreases or, in other words, the absolute value of the coefficient, which is usually negative, increases as the amount of nickel in the composition of the magnet alloy increases. In this regard, the suffix y in the compositional formulas given before should be larger than a certain lower limit in order to obtain a significant decrease of the reversible temperature coefficient. The amount of nickel in the inventive magnet alloy, however, is limited to a content corresponding to a value of y equal to 0.6 since the addition of nickel in the rare earth metal-containing magnet alloy is detrimental to the ordinary magnetic properties, e.g. coercive force, residual magnetization and maximum energy product. For example, a cerium-cobalt based permanent magnet prepared with addition of nickel in an amount corresponding to y=0.6 has values of these parameters each about a half as large as the value obtained with the similar magnets without addition of nickel or even smaller. This is the reason for the upper limit of the value of y at 0.6. The lower limit of y at 0.01 is of course determined since no significant decrease is obtained in the reversible temperature coefficient of the permanent magnet when the amount of nickel is smaller than that.

Copper is also an essential component in the inventive magnet alloy and the value of x in the compositional formulas should be in the range from 0.001 to 0.5. When the amount of copper is smaller than that, the permanent magnet has an insufficient coercive force while an excessively large amount of copper in the alloy results in a decreased residual magnetization.

Further adjuvant elements, i.e. one or a combination of calcium, silicon and transition metals other than nickel and cobalt, are added to the magnet alloy according to desire and addition of these elements is effective in increasing the coercive force of the magnet. However, an excessively large amount of these elements results in a decreased density of the residual magnetic flux so that the value of u in the compositional formula given second should not exceed 0.6. The transition metals other than nickel and cobalt are preferably selected from the group consisting of zirconium, titanium, hafnium, manganese, tantalum, niobium and chromium. At any rate, the magnetic properties, i.e. coercicve force, residual magnetization and maximum energy product can be controlled by suitably selecting the kinds of the rare earth metal and the optional adjuvant element or elements as well as the atomic ratios of the individual component elements expressed by the suffixes x, y, u and z.

The procedure for the preparation of the permanent magnet of the inventive alloy is much the same as in the preparation of the conventional rare earth metal-containing permanent magnets containing no nickel. That is, the individual metallic components according to the compositional formula, i.e. the rare earth metal, cobalt, copper, nickel and one or more of the optional adjuvant elements, are taken each in a calculated amount and melted together under an inert atmosphere in a suitable furnace such as a high frequency induction furnace followed by cooling into an alloy ingot. The ingot is then crushed into lumps or coarse grains and further pulverized into a fine powder having an average particle diameter of about 2 to 10 μm by use of a known pulverizing machine such as a jet mill. The powder of the alloy is then shaped by compression molding under a pressure of about 1 ton/cm$^2$ in a magnetic field of about 10 kOe for the alignment of the alloy particles and the thus shaped piece of the alloy is sintered for at least 1 hour at a temperature known in the art to obtain the highest values of the magnetic properties according to desire. Aging treatment of the sintered body at a constant temperature of 500° to 800° C. or a cooling at a controlled cooling rate down to about 400° C. from a starting temperature of 500° to 850° C. is effective in order to obtain a further increased value of the coercive force $_iH_c$.

The content of nickel in the inventive magnet alloy is determinant of the reversible temperature coefficient of the permanent magnet prepared from the alloy and the coefficient is controlled in a wide range of from −0.03 to −0.6%/°C. depending on the amount of the nickel in the alloy. Therefore, the permanent magnets prepared from the inventive magnet alloy are very useful for producing the magnetic bias field in the magnetic bubble domain memory devices formed with a variety of the magnetic bubble domain materials and used usually in a temperature range of from −50° to +100° C.

In the following, examples are given for the illustration of the present invention in further detail but without an object to limit the scope of the invention in any way.

EXAMPLE 1

Metallic cerium, cobalt, copper, nickel and iron were taken each in a calculated amount and melted together under an inert atmosphere in a high frequency induction furnace followed by cooling into an alloy ingot. The composition of this ingot was expressed by the following formula:

$$Ce(Co_{0.71-y}Cu_{0.14}Ni_yFe_{0.15})_{5.0}.$$

The amount of nickel was varied in such a range that the largest value of y in the above formula was 0.6. In one experiment, nickel was omitted from the formulation for comparison.

The alloy ingot was crushed into coarse granules and then finely pulverized in a jet mill and the alloy powder was shaped by compression molding in a magnetic field. The thus shaped body of the alloy was sintered for 1.5 hours in a stream of argon at a temperature of 1050° to 1080° C. followed by the aging treatment at 500° C. for 2 hours.

The magnetic properties, i.e. maximum energy product $(BH)_{max}$, residual magnetization $B_r$ and coercive force $_iH_c$, and the reversible temperature coefficient of the thus prepared permanent magnets were determined with a vibration-type magnetometer each as a function of the content of nickel in the alloy. The results are shown in the table below. The maximum energy product and the residual magnetization decreased steadily as the content of nickel in the alloy was increased while the coercive force was maximum at y=0.18. The reversible temperature coefficient of the magnet also decreased, i.e. the absolute value of the coefficient increased, steadily with the increse of the content of nickel in the alloy.

TABLE

| g | 0 | 0.18 | 0.4 | 0.6 |
|---|---|---|---|---|
| Maximum energy product $(BH)_{max}$, MGOe | 12 | — | — | 2 |
| Residual magnetization $B_r$, kG | 7.2 | — | — | 3 |
| Coercive force $_iH_c$, kOe | 5.5 | 6.3 | — | 3.6 |
| Reversible temperature coefficient, %/°C. | −0.09 | — | −0.42 | −0.6 |

The above prepared permanent magnets containing nickel were used as coupled with a magnetic bubble domain element prepared by the liquid-phase epitaxial growth of a magnetic bubble domain material on the surface of a single crystal wafer of gadolinium gallium garnet to form a magnetic bubble domain memory device, which was found to work quite satisfactorily under the magnetic bias field of the magnet in a temperature range from −50° C. to +80° C.

EXAMPLE 2

Permanent magnets were prepared in about the same manner as in Example 1 above from metallic samarium, cobalt, copper, nickel, iron and zirconium with varied amounts of the nickel to give compositions expressed by the formula $$Sm(Co_{0.68-y}Cu_{0.11}Ni_yFe_{0.2}Zr_{0.01})_{6.8},$$

in which y was varied up to 0.6. The sintering temperature was higher for the alloys with larger contents of nickel in the range from 1150° to 1200° C. and the sintered bodies were subjected to the aging treatment by cooling at a controlled rate of 2° to 1° C./minute down to 400° C. from a starting temperature of 700° to 800° C.

The reversible temperature coefficients of these permanent magnets were determined with a vibration-type magnetometer to find that the coefficient steadily decreased with the increase of the content of nickel in the alloy starting from −0.03%/°C. for the magnet without nickel, i.e. y=0, to −0.2%/°C. at y=0.4 and −0.3%/°C. at y=0.6.

These permanent magnets containing nickel were found to be satisfactory as a permanent magnet for producing magnetic bias field in a magnetic bubble domain memory device when coupled with a magnetic bubble domain element prepared by the liquid-phase epitaxial growth of a magnetic bubble domain material on the surface of a single crystal wafer of gadolinium gallium garnet.

EXAMPLE 3

A permanent magnet was prepared in about the same manner as in Example 1 from metallic cerium, cobalt copper and nickel having a composition expressed by the formula $$Ce(Co_{0.66}Cu_{0.14}Ni_{0.20})_5.$$

The reversible temperature coefficient of this permanent magnet was −0.19%/°C. in substantial decrease in comparison with the value of −0.09%/°C. obtained with a permanent magnet having the same composition but without the addition of nickel.

This permanent magnet was tested as a magnet for producing the mgnetic bias field in a magnetic bubble domain memory device as coupled with a magnetic bubble domain element prepared by the liquid-phase epitaxial growth of a magnetic bubble domain material on a substrate of a single crystal wafer of gadolinium gallium garnet and found to work quite satisfactorily.

What is claimed is:

1. A method for producing a magnetic bias field in a magnetic bubble domain memory device, said method comprising coupling a magnetic bubble domain element with a permanent magnet, said permanent magnet being formed of a rare earth metal-containing alloy having the general formula $$R(Co_{1-x-y}Cu_xNi_y)_z,$$

in which R is a rare earth element and x, y and z are each positive numbers, x ranges from 0.001 to 0.4, y ranges from 0.001 to 0.6, and z ranges from 4.0 to 9.0, with the proviso that x+y is less than 1.

2. The method of claim 1, wherein said rare earth metal containing alloy further contains an auxiliary adjuvant element denoted by M so that said alloy has the general formula $$R(Co_{1-x-y-u}Cu_xNi_yM_u)_z,$$

wherein M is at least one member selected from the group consisting of calcium, silicon and at least one transition metal other than nickel and cobalt, and u is a positive number not exceeding 0.6, with the proviso that x+y+u is less than 1.

3. The method of claims 1 or 2, wherein said rare earth element denoted by R is at least one member selected from the group consisting of samarium and cerium.

4. The method of claim 2, wherein said transition metal other than nickel and cobalt is a metal selected from the group consisting of zirconium, titanium, hafnium, manganese, tantalum, niobium and chromium.

* * * * *